US009184228B2

United States Patent
Seki et al.

(10) Patent No.: US 9,184,228 B2
(45) Date of Patent: *Nov. 10, 2015

(54) COMPOSITE BASE INCLUDING SINTERED BASE AND BASE SURFACE FLATTENING LAYER, AND COMPOSITE SUBSTRATE INCLUDING THAT COMPOSITE BASE AND SEMICONDUCTOR CRYSTALLINE LAYER

(75) Inventors: Yuki Seki, Itami (JP); Issei Satoh, Itami (JP); Koji Uematsu, Itami (JP); Yoshiyuki Yamamoto, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 605 days.

This patent is subject to a terminal disclaimer.

(21) Appl. No.: 13/107,241

(22) Filed: May 13, 2011

(65) Prior Publication Data
US 2012/0228612 A1    Sep. 13, 2012

(30) Foreign Application Priority Data

Mar. 7, 2011    (JP) .................................. 2011-049246

(51) Int. Cl.
*H01L 29/04*    (2006.01)
*H01L 29/02*    (2006.01)
(Continued)

(52) U.S. Cl.
CPC .......... *H01L 29/02* (2013.01); *H01L 21/76254* (2013.01); *H01L 27/1214* (2013.01);
(Continued)

(58) Field of Classification Search
CPC ..................... H01L 21/76254; H01L 27/1214; H01L 27/1266; H01L 29/02; Y10T 428/24355; B32B 2264/102; B32B 2457/14; B32B 2307/704

USPC .................................................. 438/458, 483
See application file for complete search history.

(56) References Cited

U.S. PATENT DOCUMENTS 5,290,393 A    3/1994 Nakamura
5,357,399 A    10/1994 Salisbury
(Continued)

FOREIGN PATENT DOCUMENTS

CN    1471733 A    1/2004
CN    101246899 A    8/2008
(Continued)

OTHER PUBLICATIONS

Qian, Weida et al., Structural Defects and their relationship to nucleation of GaN thin films; MRS Proceedings; vol. 423; published 1996; pp. 475-486.*

(Continued)

*Primary Examiner* — Mohammad Islam
*Assistant Examiner* — John D Dulka
(74) *Attorney, Agent, or Firm* — Drinker Biddle & Reath LLP (57) ABSTRACT

A composite base of the present invention includes a sintered base and a base surface flattening layer disposed on the sintered base, and the base surface flattening layer has a surface RMS roughness of not more than 1.0 nm. A composite substrate of the present invention includes the composite base and a semiconductor crystal layer disposed on a side of the composite base where the base surface flattening layer is located, and a difference between a thermal expansion coefficient of the sintered base and a thermal expansion coefficient of the semiconductor crystal layer is not more than $4.5\times10^{-6}K^{-1}$. Thereby, a composite substrate in which a semiconductor crystal layer is attached to a sintered base, and a composite base suitably used for that composite substrate are provided.

7 Claims, 3 Drawing Sheets

(51) Int. Cl.
*H01L 21/762* (2006.01)
*H01L 27/12* (2006.01)

(52) U.S. Cl.
CPC ....... *H01L27/1266* (2013.01); *B32B 2264/102* (2013.01); *B32B 2307/704* (2013.01); *B32B 2457/14* (2013.01); *Y10T 428/24355* (2015.01)

(56) References Cited

U.S. PATENT DOCUMENTS

| | | | |
|---|---|---|---|
| 6,413,627 | B1 | 7/2002 | Motoki et al. |
| 8,497,185 | B2 * | 7/2013 | Seki et al. ............ 438/455 |
| 8,697,550 | B2 | 4/2014 | Satoh et al. |
| 8,697,564 | B2 | 4/2014 | Fujiwara et al. |
| 2002/0114993 | A1 * | 8/2002 | Miyaki et al. .......... 429/137 |
| 2004/0033638 | A1 | 2/2004 | Bader et al. |
| 2006/0163605 | A1 * | 7/2006 | Miyahara ............... 257/103 |
| 2006/0255341 | A1 | 11/2006 | Pinnington et al. |
| 2008/0169483 | A1 | 7/2008 | Kasai et al. |
| 2008/0296585 | A1 | 12/2008 | Matsumoto et al. |
| 2009/0098739 | A1 | 4/2009 | Ohnuma et al. |
| 2009/0224370 | A1 | 9/2009 | Slutz |
| 2009/0278233 | A1 * | 11/2009 | Pinnington et al. ....... 257/615 |
| 2010/0210089 | A1 | 8/2010 | Kasai et al. |
| 2012/0119218 | A1 | 5/2012 | Su |
| 2012/0122301 | A1 | 5/2012 | Fujiwara et al. |
| 2013/0040442 | A1 | 2/2013 | Satoh et al. |
| 2013/0221492 | A1 | 8/2013 | Seki et al. |

FOREIGN PATENT DOCUMENTS

| | | |
|---|---|---|
| CN | 101319402 A | 12/2008 |
| JP | 4-297023 | 10/1992 |
| JP | 2000-022212 A | 1/2000 |
| JP | 2000-044400 A | 2/2000 |
| JP | 2002-293697 A | 10/2002 |
| JP | 2003-165798 | 6/2003 |
| JP | 2006-261476 A | 9/2006 |
| JP | 2007-523472 | 8/2007 |
| JP | 2007-246289 A | 9/2007 |
| JP | 2008-010766 A | 1/2008 |
| JP | 2010-182936 A | 8/2010 |
| WO | 2005/076345 | 8/2005 |

OTHER PUBLICATIONS

Shackelford, J.F. et al. (Eds.); Ceramic and glass materials, structure, properties and processing; Chapter 2: Mullite; Springer Science+Business Media; published 2008; pp. 27-39.*

English language version of Japanese Industrial Standard ("JIS") JIS B 0601-2001

U.S. Office Action dated Jun. 19, 2013 that issued in U.S. Appl. No. 13/643,206 including Double Patenting Rejections on pp. 2-4.

* cited by examiner

COMPOSITE BASE INCLUDING SINTERED BASE AND BASE SURFACE FLATTENING LAYER, AND COMPOSITE SUBSTRATE INCLUDING THAT COMPOSITE BASE AND SEMICONDUCTOR CRYSTALLINE LAYER

BACKGROUND OF THE INVENTION

1. Field of the Invention

The present invention relates to a composite substrate suitably used for a semiconductor device, and a composite base suitably used for that composite substrate.

2. Description of the Background Art

Composite substrates in which a semiconductor crystal layer is attached to a different composition base having a chemical composition different from that of the semiconductor crystal layer have been proposed to efficiently manufacture semiconductor devices with excellent properties.

For example, Japanese Patent Laying-Open No. 2003-165798 discloses a method of manufacturing a gallium nitride single crystal substrate by attaching a single crystal sapphire substrate to a base to fabricate a sapphire composite substrate and epitaxially growing a gallium nitride single crystal on a sapphire surface of the sapphire composite substrate.

SUMMARY OF THE INVENTION

In the method disclosed in Japanese Patent Laying-Open No. 2003-165798, in the case of a sintered base in which a base is formed of a sintered body, there is a problem that, since the sintered base has a large surface roughness and has vacancies, it is difficult to form a flat bonding layer thereon, and to attach a semiconductor crystal layer to the sintered base.

There is another problem that, even though a surface of the sintered base is ground or polished, it is difficult to reduce the surface roughness of the sintered base, because the sintered base has internal vacancies and crystal grains of the base are likely to fall off.

To solve the aforementioned problems, one object of the present invention is to provide a composite substrate in which a semiconductor crystal layer is attached to a sintered base, and a composite base suitably used for that composite substrate.

According to an aspect, the present invention is directed to a composite base including a sintered base and a base surface flattening layer disposed on the sintered base, wherein the base surface flattening layer has a surface RMS (root mean square) roughness of not more than 1.0 nm.

In the composite base in accordance with the present invention, the base surface flattening layer can include at least one selected from the group consisting of silicon oxide, silicon nitride, silicon oxynitride, metal oxide, metal nitride, and metal oxynitride.

Further, according to another aspect, the present invention is directed to a composite substrate including the composite base described above and a semiconductor crystal layer disposed on a side of the composite base where the base surface flattening layer is located, wherein a difference between a thermal expansion coefficient of the sintered base and a thermal expansion coefficient of the semiconductor crystal layer is not more than $4.5 \times 10^{-6} K^{-1}$.

In the composite substrate in accordance with the present invention, the base surface flattening layer can include at least one selected from the group consisting of silicon oxide, silicon nitride, silicon oxynitride, metal oxide, metal nitride, and metal oxynitride. In addition, the semiconductor crystal layer can include at least one selected from the group consisting of a group III-V compound semiconductor crystal, a group II-VI compound semiconductor crystal, and an oxide semiconductor crystal.

Further, the composite substrate in accordance with the present invention can further include a bonding layer disposed between the base surface flattening layer and the semiconductor crystal layer. Furthermore, the composite substrath in accordance with the present invention can further include a crystal surface flattening layer disposed between the semiconductor crystal layer and the bonding layer to be in contact with the semiconductor crystal layer. Here, the crystal surface flattening layer can include at least one selected from the group consisting of silicon oxide, silicon nitride, silicon oxynitride, metal oxide, metal nitride, and metal oxynitride.

According to the present invention, a composite substrate in which a semiconductor crystal layer is attached to a sintered base, and a composite base suitably used for that composite substrate can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]
{Composite Base}

Figure 1:
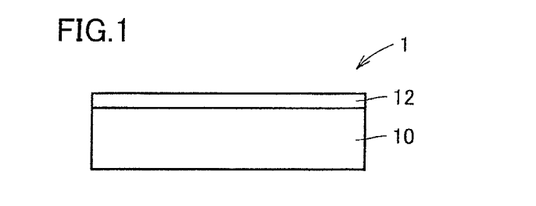
FIG. 1 is a schematic cross sectional view showing an example of a composite base in accordance with the present invention.

Referring to FIG. 1, a composite base 1 as one embodiment of the present invention includes a sintered base 10, and a base surface flattening layer 12 disposed on sintered base 10. Base surface flattening layer 12 has a surface RMS (root mean square) roughness of not more than 1.0 nm.

Since base surface flattening layer 12 disposed on sintered base 10 has a surface RMS roughness of not more than 1.0 nm in composite base 1 in the present embodiment, a composite substrate can be obtained by attaching a semiconductor crystal layer to base surface flattening layer 12. Further, since a bonding layer having even and flat surfaces can be formed on base surface flattening layer 12 in composite base 1 in the present embodiment for the same reason, a composite substrate can be obtained by attaching a semiconductor crystal layer to base surface flattening layer 12 with the bonding layer interposed therebetween.

(Sintered Base)

In composite base 1 in the present embodiment, sintered base 10 formed of a sintered body is used as a base, from the viewpoint that the thermal expansion coefficient of the base can be easily adjusted by changing the chemical composition of the base. Here, although sintered base 10 is not particularly limited, it preferably includes at least one selected from the group consisting of silicon oxide, silicon oxynitride, metal oxide, metal nitride, and metal oxynitride, from the viewpoint of improving heat resistance and strength. Suitable examples of the silicon oxide include $SiO_2$ and the like, suitable examples of the silicon oxynitride include SiON and the like, suitable examples of the metal oxide include MgO, $Al_2O_3$, $TiO_2$, $Y_2O_3$, and the like, and suitable examples of a composite oxide made of the silicon oxide and the metal oxide include MgO—$SiO_2$, $Al_2O_3$—$SiO_2$, $TiO_2$—$SiO_2$, and the like. Suitable examples of the metal nitride include TiN, GaN, AlN, HfN, and the like. Suitable examples of the metal oxynitride include aluminum oxynitride, tantalum oxynitride, and the like.

(Base Surface Flattening Layer)

Base surface flattening layer 12 in composite base 1 in the present embodiment is required to have a surface RMS roughness of not more than 1.0 nm, preferably not more than 0.7 nm, and more preferably not more than 0.5 nm, from the viewpoint that a semiconductor crystal layer can be attached thereon, or from the viewpoint that a bonding layer having even and flat surfaces can be formed thereon and further a semiconductor crystal layer can be attached to the bonding layer. Here, the surface RMS (root mean square) roughness is obtained by sampling a portion of a roughness curved plane by a reference area in the direction of its average plane, and calculating the root square of the average value of squares of deviations from the average plane to a measurement curved plane in the sampling portion, and is equivalent to Rq defined in JIS B0601-2001. The surface RMS roughness can be measured with an AFM (atomic force microscope).

Although base surface flattening layer 12 is not particularly limited, it preferably includes at least one selected from the group consisting of silicon oxide, silicon nitride, silicon oxynitride, metal oxide, metal nitride, and metal oxynitride, from the viewpoint of high surface flatness and high bondability to the semiconductor crystal layer and the bonding layer. Suitable examples of the silicon oxide include $SiO_2$ and the like, suitable examples of the silicon nitride include $Si_3N_4$ and the like, suitable examples of the silicon oxynitride include SiON and the like, suitable examples of the metal oxide include MgO, $Al_2O_3$, $TiO_2$, $Y_{2O3}$, and the like, and suitable examples of a composite oxide made of the silicon oxide and the metal oxide include MgO—$SiO_2$, $Al_2O_3$—$SiO_2$, $TiO_2$—$SiO_2$, and the like. Suitable examples of the metal nitride include TiN, GaN, AlN, HfN, and the like. Suitable examples of the metal oxynitride include aluminum oxynitride, tantalum oxynitride, and the like.

Further, although the thickness of base surface flattening layer 12 is not particularly limited, it is preferably not less than 0.1 μm, and more preferably not less than 0.5 μm, from the viewpoint of setting the surface RMS roughness of base surface flattening layer 12 disposed on sintered base 10 to as small as not more than 1.0 nm. In addition, the thickness of base surface flattening layer 12 is preferably not more than 50 μm, and more preferably not more than 20 μm, from the viewpoint of reducing the cost for forming base surface flattening layer 12.

{Method of Manufacturing Composite Base}

Referring to FIG. 1, a method of manufacturing composite base 1 in the present embodiment includes the steps of preparing sintered base 10 and forming base surface flattening layer 12 on sintered base 10. The method can further include the step of polishing a surface of base surface flattening layer 12.

(Step of Preparing Sintered Base)

In the step of preparing sintered base 10, sintered base 10 is obtained by sintering raw material powder including at least one selected from the group consisting of silicon oxide and metal oxide. Suitable examples of the silicon oxide include $SiO_2$ and the like, suitable examples of the metal oxide include MgO, $Al_2O_3$, $TiO_2$, and the like, and suitable examples of a composite oxide made of the silicon oxide and the metal oxide include MgO—$SiO_2$, $Al_2O_3$—$SiO_2$, $TiO_2$—$SiO_2$, and the like. In sintering, sintered base 10 having a different thermal expansion coefficient can be obtained by changing the chemical composition of the raw material powder.

(Step of Forming Base Surface Flattening Layer)

In the step of forming base surface flattening layer 12, although a method of forming base surface flattening layer 12 is not particularly limited, a gas phase method such as a CVD (chemical vapor deposition) method, a sputtering method, and a deposition method, a liquid phase method such as a spin coating method and a thermal spraying method, or the like is preferable, from the viewpoint of forming the base surface flattening layer having a small surface RMS roughness. In particular, the spin coating method, the CVD method, the deposition method, or the like is preferable, from the viewpoint of forming the base surface flattening layer having an extremely small surface RMS roughness of about 1.0 nm or smaller.

(Step of Polishing Surface of Base Surface Flattening Layer)

The method of manufacturing composite base 1 in the present embodiment preferably includes the step of polishing a surface of base surface flattening layer 12 after the step of forming base surface flattening layer 12, in order to ensure that base surface flattening layer 12 disposed on sintered base 10 has a surface RMS roughness of not more than 1.0 nm. A method of polishing the surface of base surface flattening layer 12 is not particularly limited as long as it can set the surface RMS roughness to not more than 1.0 nm. Suitable examples of the method include mechanical polishing, chemical mechanical polishing (CMP), chemical polishing, and the like.

[Embodiment 2]

{Composite Substrate}

Figure 2:
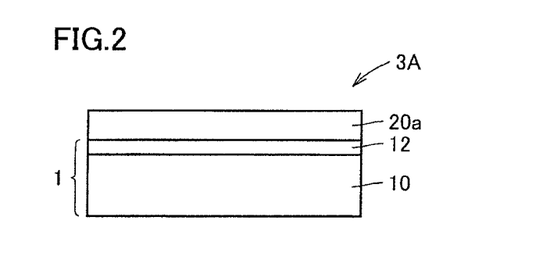
FIG. 2 is a schematic cross sectional view showing an example of a composite substrate in accordance with the present invention.
Figure 3:
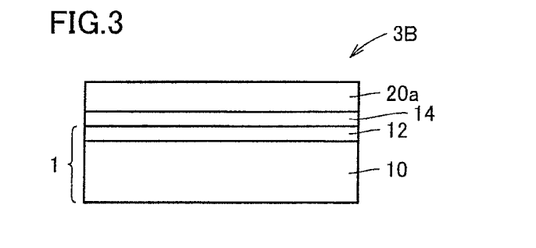
FIG. 3 is a schematic cross sectional view showing another example of the composite substrate in accordance with the present invention.
Figure 4:
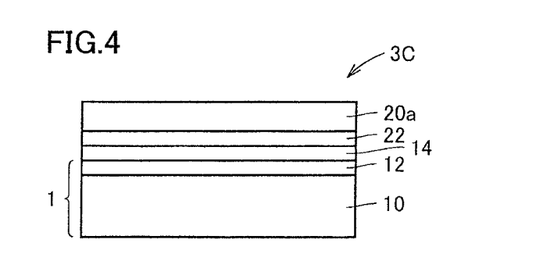
FIG. 4 is a schematic cross sectional view showing still another example of the composite substrate in accordance with the present invention.

Referring to FIGS. 2 to 4, a composite substrate 3A, 3B, 3C as another embodiment in accordance with the present invention includes composite base 1 in Embodiment 1, and a semiconductor crystal layer 20a disposed on a side of composite base 1 where base surface flattening layer 12 is located. A difference between a thermal expansion coefficient of sintered base 10 and a thermal expansion coefficient of the semiconductor crystal layer is not more than $4.5 \times 10^{-6} K^{-1}$, preferably not more than $2.0 \times 10^{-6} K^{-1}$.

Since composite substrate 3A, 3B, 3C in the present embodiment has a high bondability between composite base 1 and semiconductor crystal layer 20a, and has a small difference between the thermal expansion coefficient of sintered base 10 in composite base 1 and the thermal expansion coefficient of semiconductor crystal layer 20a of not more than $4.5 \times 10^{-6} K^{-1}$, a semiconductor layer with high crystallinity can be epitaxially grown on semiconductor crystal layer 20a of composite substrate 3A, 3B, 3C without occurrence of cracks, and thus a semiconductor device with excellent properties can be formed.

Composite substrates 3A, 3B, 3C in the present embodiment take several different concrete forms, depending on differences in the bonding form between composite base 1 and semiconductor crystal layer 20a. Their concrete forms will be each described below.

(Composite Substrate 3A)

Referring to FIG. 2, composite substrate 3A includes composite base 1, and semiconductor crystal layer 20a disposed on base surface flattening layer 12 of composite base 1. For example, composite substrate 3A has a form in which base surface flattening layer 12 of composite base 1 and semiconductor crystal layer 20a are directly bonded to each other. In such composite substrate 3A, sintered base 10 and semiconductor crystal layer 20a can be bonded by base surface flattening layer 12 disposed on sintered base 10.

(Composite Substrate 3B)

Referring to FIG. 3, composite substrate 3B further includes a bonding layer 14 disposed between base surface flattening layer 12 and semiconductor crystal layer 20a in composite substrate 3A (FIG. 2). For example, composite substrate 3B has a form in which base surface flattening layer 12 of composite base 1 and semiconductor crystal layer 20a are bonded with bonding layer 14 interposed therebetween. In such composite substrate 3B, bondability between base surface flattening layer 12 of composite base 1 and semiconductor crystal layer 20a is improved by bonding layer 14.

Here, although bonding layer 14 is not particularly limited, it is preferably made of silicon oxide, metal oxide, metal nitride, or the like, from the viewpoint of a high effect of improving the bondability between base surface flattening layer 12 of composite base 1 and semiconductor crystal layer 20a. In addition, although the thickness of bonding layer 14 is not particularly limited, it is preferably not less than 10 nm and not more than 10000 nm, and more preferably not less than 200 nm and not more than 2000 nm, from the viewpoint of a high effect of improving the bondability between base surface flattening layer 12 and semiconductor crystal layer 20a.

(Composite Substrate 3C)

Referring to FIG. 4, composite substrate 3C further includes a crystal surface flattening layer 22 disposed between semiconductor crystal layer 20a and bonding layer 14 in composite substrate 3B (FIG. 3) to be in contact with semiconductor crystal layer 20a. For example, composite substrate 3C has a form in which base surface flattening layer 12 of composite base 1 and crystal surface flattening layer 22 in contact with semiconductor crystal layer 20a are bonded with bonding layer 14 interposed therebetween. In such composite substrate 3C, the bondability between base surface flattening layer 12 of composite base 1 and semiconductor crystal layer 20a is further improved by bonding layer 14 and crystal surface flattening layer 22.

Here, although crystal surface flattening layer 22 is not particularly limited, it preferably includes at least one selected from the group consisting of silicon oxide, silicon nitride, silicon oxynitride, metal oxide, metal nitride, and metal oxynitride, from the viewpoint of high surface flatness and high bondability to the bonding layer. Suitable examples of the silicon oxide include $SiO_2$ and the like, suitable examples of the silicon nitride include $Si_3N_4$ and the like, suitable examples of the silicon oxynitride include SiON and the like, suitable examples of the metal oxide include MgO, $Al_2O_3$, $TiO_2$, $Y_2O_3$, and the like, and suitable examples of a composite oxide made of the silicon oxide and the metal oxide include MgO—$SiO_2$, $Al_2O_3$—$SiO_2$, $TiO_2$—$SiO_2$, and the like. Suitable examples of the metal nitride include TiN, GaN, AlN, HfN, and the like. Suitable examples of the metal oxynitride include aluminum oxynitride, tantalum oxynitride, and the like.

Further, although the thickness of crystal surface flattening layer 22 is not particularly limited, it is preferably not less than 0.1 μm, and more preferably not less than 0.5 μm, from the viewpoint of setting the surface RMS roughness of crystal surface flattening layer 22 disposed in contact with semiconductor crystal layer 20a to as small as not more than 1.0 nm. In addition, the thickness of crystal surface flattening layer 22 is preferably not more than 50 μm, and more preferably not more than 20 μm, from the viewpoint of reducing the cost for forming base surface flattening layer 12.

Furthermore, although semiconductor crystal layer 20a is not particularly limited, it preferably includes at least one selected from the group consisting of a group III-V compound semiconductor crystal, a group II-VI compound semiconductor crystal, and an oxide semiconductor crystal, from the viewpoint of reducing a used amount of an expensive crystal, and achieving high effects of resource saving and cost reduction. Suitable examples of the group III-V compound semiconductor crystal include a GaAs crystal, a GaN crystal, an AlN crystal, an $Al_xGa_{1-x}N$ crystal (0<x<1), an $In_yGa_{1-y}N$ crystal (0≤y≤1), and the like. Suitable examples of the group II-VI compound semiconductor crystal include a CdSe crystal, a ZnS crystal, and the like. Suitable examples of the oxide semiconductor crystal include a ZnO crystal, an ITO (indium tin oxide) crystal, a $TiO_2$ crystal, and the like.

{Method of Manufacturing Composite Substrate}

Figure 5:
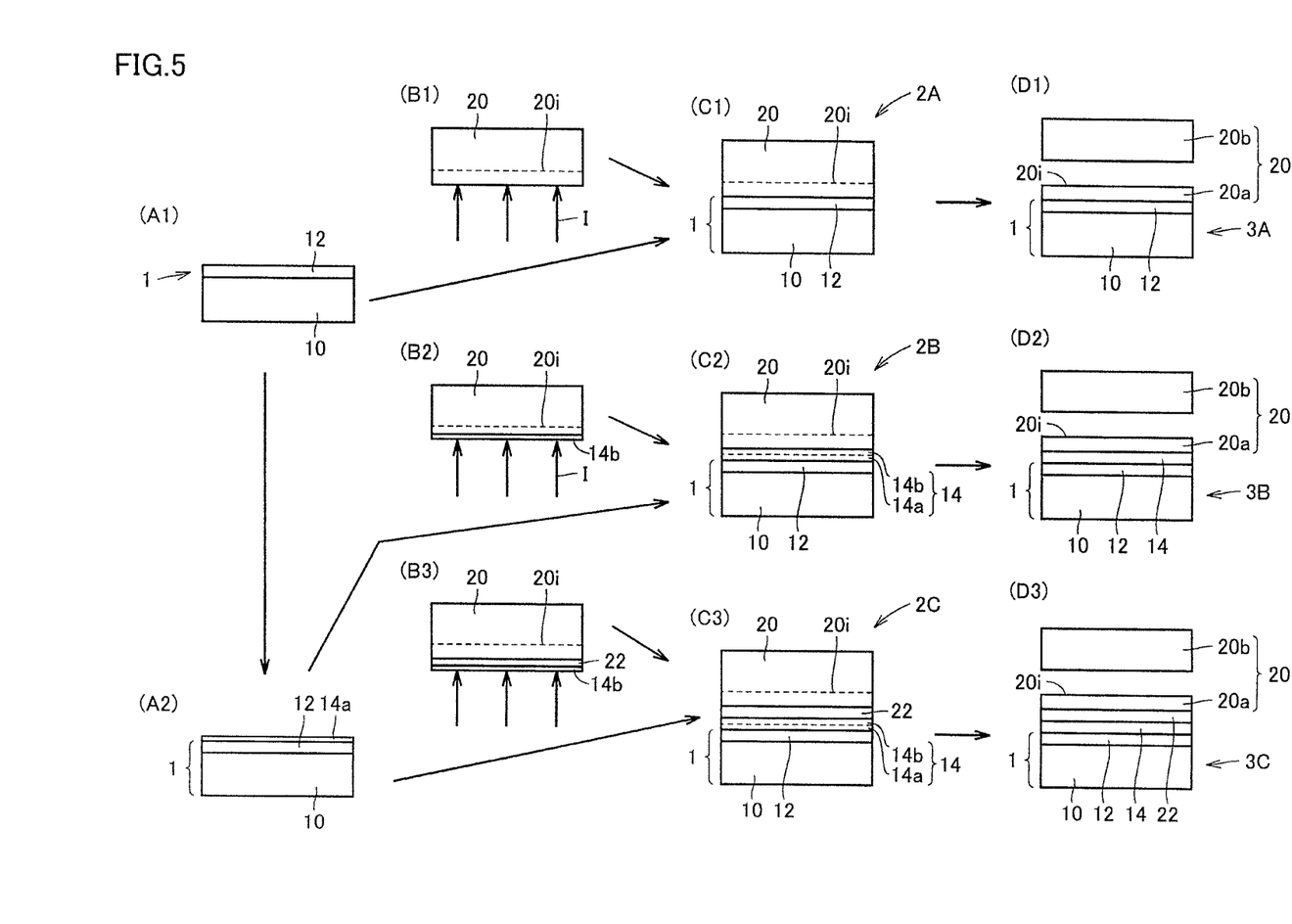
FIG. 5 is a schematic cross sectional view showing examples of a method of manufacturing the composite substrate in accordance with the present invention.

Referring to FIG. 5, a method of manufacturing composite substrate 3A, 3B, 3C in the present embodiment is performed by attaching semiconductor crystal layer 20a on the side of composite base 1 where base surface flattening layer 12 is located. With such a manufacturing method, composite substrate 3A, 3B, 3C having semiconductor crystal layer 20a with high crystallinity can be efficiently obtained. Composite substrate 3A, composite substrate 3B, and composite substrate 3C have respectively different bonding forms between composite base 1 and semiconductor crystal layer 20a, and they are manufactured through respectively different processes described below.

(Method of Manufacturing Composite Substrate 3A)

Referring to FIG. 5, the method of manufacturing composite substrate 3A includes the step of preparing composite base 1 (FIG. 5(A1)), the step of preparing a semiconductor crystal body 20 in which an ion implanted region 20i is formed at a predetermined depth from a surface (FIG. 5(B1)), the step of attaching a surface of base surface flattening layer 12 of composite base 1 and the surface of semiconductor crystal body 20 on a side where ion implanted region 20i is located (FIG. 5(C1)), and the step of separating semiconductor crystal body 20 at ion implanted region 20i (FIG. 5(D1)).

Referring to FIG. 5(A1), the step of preparing composite base 1 is identical to the method of manufacturing composite base 1 in Embodiment 1, and thus will not be repeated here.

Referring to FIG. 5(B1), the step of preparing semiconductor crystal body 20 in which ion implanted region 20i is formed is performed by implanting ions I from the surface of semiconductor crystal body 20 to a region at the predetermined depth. Although ions I to be implanted are not particularly limited, ions having a small mass number, for example, hydrogen ions, helium ions, or the like are preferable, from the viewpoint of reducing a decrease in the crystallinity of semiconductor crystal body 20 due to ion implantation. Ion implanted region 20i in semiconductor crystal body 20 is more brittle than the remaining region due to ion implantation.

Referring to FIG. 5(C1), an attachment method in the step of attaching the surface of base surface flattening layer 12 of composite base 1 and the surface of semiconductor crystal body 20 on the side where ion implanted region 20i is located is not particularly limited, and a method such as a direct bonding method in which surfaces to be attached to each other are cleaned and directly attached, and thereafter bonded by being heated to 30° C. to 1000° C., or a surface activation method in which surfaces to be attached to each other are activated by plasma, ions, or the like and bonded, can be suitably used. Thus, a base-crystal bonded body 2A in which semiconductor crystal body 20 is directly bonded to base surface flattening layer 12 of composite base 1 is obtained.

Referring to FIG. 5(D1), a separation method in the step of separating semiconductor crystal body 20 at ion implanted region 20i is not particularly limited, and a method of applying heat and/or stress to attached base-crystal bonded body 2A can be suitably used. With such a method, semiconductor crystal body 20 is separated, at brittle ion implanted region 20i thereof, into semiconductor crystal layer 20a bonded to base surface flattening layer 12 of composite base 1 and a remaining semiconductor crystal body 20b, and thus composite substrate 3A including composite base 1 and semiconductor crystal layer 20a bonded to base surface flattening layer 12 of composite base 1 is efficiently obtained.

(Method of Manufacturing Composite Substrate 3B)

Referring to FIG. 5, the method of manufacturing composite substrate 3B includes the step of preparing composite base 1 in which a bonding layer 14a is formed on base surface flattening layer 12 (FIG. 5(A2)), the step of preparing semiconductor crystal body 20 in which a bonding layer 14b is formed on a surface and ion implanted region 20i is formed at a predetermined depth from an interface between semiconductor crystal body 20 and bonding layer 14 (FIG. 5(B2)), the step of attaching a surface of bonding layer 14a formed on base surface flattening layer 12 of composite base 1 and a surface of bonding layer 14b formed on semiconductor crystal body 20 described above (FIG. 5(C2)), and the step of separating semiconductor crystal body 20 at ion implanted region 20i (FIG. 5(D2)). It is to be noted that bonding layer 14b formed on semiconductor crystal body 20 can be omitted.

Referring to FIG. 5(A2), in the step of preparing composite base 1 described above, a method of forming bonding layer 14a on base surface flattening layer 12 of composite base 1 is not particularly limited, and the sputtering method, the CVD method, the deposition method, or the like can be suitably used.

Referring to FIG. 5(B2), in the step of preparing semiconductor crystal body 20 described above, a method of forming bonding layer 14b on the surface of semiconductor crystal body 20 is not particularly limited, and the sputtering method, the CVD method, the deposition method, or the like can be suitably used. Further, a method of forming ion implanted region 20i at the predetermined depth from the interface between semiconductor crystal body 20 and bonding layer 14 is performed by implanting ions I from the interface to a region at the predetermined depth in semiconductor crystal body 20. As ions I to be implanted, ions having a small mass number, for example, hydrogen ions, helium ions, or the like are preferable. Ion implanted region 20i in semiconductor crystal body 20 is more brittle than the remaining region due to ion implantation.

Referring to FIG. 5(C2), in the step of attaching the surface of bonding layer 14a formed on base surface flattening layer 12 of composite base 1 and the surface of bonding layer 14b formed on semiconductor crystal body 20 described above, an attachment method such as the direct bonding method, the surface activation method, or the like can be suitably used, as in the foregoing. In such attachment, it is preferable that bonding layer 14a and bonding layer 14b have an identical or approximate chemical composition, from the viewpoint of increasing bondability. When bonding layer 14a and bonding layer 14b having an identical chemical composition are bonded, bonding layer 14 is integrally formed. Thus, a base-crystal bonded body 2B in which semiconductor crystal body 20 is bonded to base surface flattening layer 12 of composite base 1 with bonding layer 14 interposed therebetween is obtained.

Referring to FIG. 5(D2), a separation method in the step of separating semiconductor crystal body 20 at ion implanted region 20i is identical to that in the method of manufacturing composite substrate 3A, and thus will not be repeated here. Consequently, composite substrate 3B including composite base 1, bonding layer 14 bonded to base surface flattening layer 12 of composite base 1, and semiconductor crystal layer 20a bonded to bonding layer 14 is efficiently obtained.

(Method of Manufacturing Composite Substrate 3C)

Referring to FIG. 5, the method of manufacturing composite substrate 3C includes the step of preparing composite base 1 in which bonding layer 14a is formed on base surface flattening layer 12 (FIG. 5(A2)), the step of preparing semiconductor crystal body 20 in which crystal surface flattening layer 22 and bonding layer 14b are formed in this order on a surface and ion implanted region 20i is formed at a predetermined depth from an interface between semiconductor crystal body 20 and crystal surface flattening layer 22 (FIG. 5(B3)), the step of attaching a surface of bonding layer 14a formed on base surface flattening layer 12 of composite base 1 and a surface of bonding layer 14b formed on crystal surface flattening layer 22 formed on semiconductor crystal body 20 described above (FIG. 5(C3)), and the step of separating semiconductor crystal body 20 at ion implanted region 20i (FIG. 5(D3)). It is to be noted that bonding layer 14b formed on semiconductor crystal body 20 can be omitted.

Referring to FIG. 5(A2), the step of preparing composite base 1 described above is identical to that in the method of manufacturing composite substrate 3B, and thus will not be repeated here.

Referring to FIG. 5(B3), in the step of preparing semiconductor crystal body 20 described above, a method of forming crystal surface flattening layer 22 on the surface of semiconductor crystal body 20 is not particularly limited, and a gas phase method such as the CVD method, the sputtering method, and the deposition method, a liquid phase method such as the spin coating method and the thermal spraying method, or the like is preferable, from the viewpoint of forming the base surface flattening layer having a small surface RMS roughness. In particular, the spin coating method, the CVD method, the deposition method, or the like is preferable, from the viewpoint of forming the base surface flattening layer having an extremely small surface RMS roughness of about 1.0 nm or smaller. Further, a method of forming bonding layer 14b on a surface of crystal surface flattening layer 22 is not particularly limited, and the sputtering method, the CVD method, the deposition method, or the like can be suitably used. Furthermore, a method of forming ion implanted region 20i at the predetermined depth from the interface between semiconductor crystal body 20 and crystal surface flattening layer 22 is performed by implanting ions I from the interface to a region at the predetermined depth in semiconductor crystal body 20. As ions I to be implanted, ions having a small mass number, for example, hydrogen ions, helium ions, or the like are preferable. Ion implanted region 20i in semiconductor crystal body 20 is more brittle than the remaining region due to ion implantation.

Referring to FIG. 5(C3), in the step of attaching the surface of bonding layer 14a formed on base surface flattening layer 12 of composite base 1 and the surface of bonding layer 14b formed on crystal surface flattening layer 22 formed on semiconductor crystal body 20 described above, an attachment method such as the direct bonding method, the surface activation method, or the like can be suitably used, as in the foregoing. In such attachment, it is preferable that bonding layer 14a and bonding layer 14b have an identical or approximate chemical composition, from the viewpoint of increasing bondability. When bonding layer 14a and bonding layer 14b having an identical chemical composition are bonded, bonding layer 14 is integrally formed. Thus, a base-crystal bonded body 2C in which semiconductor crystal body 20 on which crystal surface flattening layer 22 is fanned is bonded to base surface flattening layer 12 of composite base 1 with bonding layer 14 interposed therebetween is obtained.

Referring to FIG. 5(D3), a separation method in the step of separating semiconductor crystal body 20 at ion implanted region 20i is identical to that in the methods of manufacturing composite substrates 3A, 3B, and thus will not be repeated here. Consequently, composite substrate 3C including composite base 1, bonding layer 14 bonded to base surface flattening layer 12 of composite base 1, crystal surface flattening layer 22 bonded to bonding layer 14, and semiconductor crystal layer 20a bonded to crystal surface flattening layer 22 is efficiently obtained.

EXAMPLE A

Eleven types of composite bases (Examples A1 to A11) and one type of base (Example AR1) were fabricated as described below.

EXAMPLE A1

Referring to FIG. 1, a high-density $Al_2O_3$—$SiO_2$ sintered base (relative density: 98% by mass) with a diameter of two inches (50.8 mm) and a thickness of 500 μm was prepared as sintered base 10. A surface of the high-density $Al_2O_3$—$SiO_2$ sintered base was mechanically polished (with diamond abrasive grains) to obtain a surface RMS roughness of 8.3 nm. Here, the surface RMS roughness was measured using an AFM.

Next, a 1.5 μm-thick $SiO_2$ layer was formed as base surface flattening layer 12 on the high-density $Al_2O_3$—$SiO_2$ sintered base (sintered base 10) by the CVD method, and thereby composite base 1 including the 1.5 μm-thick $SiO_2$ layer (base surface flattening layer 12) disposed on the high-density $Al_2O_3$—$SiO_2$ sintered base (sintered base 10) was obtained. As a material for the $SiO_2$ layer, TEOS (tetraethoxysilane) was used. A surface of the $SiO_2$ layer (base surface flattening layer 12) of obtained composite base 1 was subjected to mechanical polishing and CMP (chemical mechanical polishing), and thus a small surface RMS roughness of 0.3 nm was able to be obtained. Table 1 shows the result.

EXAMPLE A2

Composite base 1 was obtained as in Example A1, except that a 1.5 μm-thick $SiO_2$ layer was formed as base surface flattening layer 12 by the spin coating method. Specifically, the $SiO_2$ layer was formed by applying Si alkoxide (a methylsiloxane polymer) as a raw material for the $SiO_2$ layer on the high-density $Al_2O_3$—$SiO_2$ sintered base (sintered base 10) by spin coating, and performing heat treatment at 400° C. A surface of the $SiO_2$ layer (base surface flattening layer 12) of obtained composite base 1 was subjected to mechanical polishing and CMP (chemical mechanical polishing), and thus a small surface RMS roughness of 0.6 nm was able to be obtained. Table 1 shows the result.

EXAMPLE A3

Composite base 1 was obtained as in Example A1, except that a 1.5 μm-thick $Al_2O_3$ layer was formed as base surface flattening layer 12 by the CVD method. As a material for the $Al_2O_3$ layer, TMA (aluminum trimethyl) was used. A surface of the $Al_2O_3$ layer (base surface flattening layer 12) of obtained composite base 1 was subjected to mechanical polishing and CMP (chemical mechanical polishing), and thus a small surface RMS roughness of 0.6 nm was able to be obtained. Table 1 shows the result.

EXAMPLE A4

Composite base 1 was obtained as in Example A1, except that a 1.5 μm-thick $Al_2O_3$ layer was formed as base surface flattening layer 12 by the spin coating method. Specifically, the $Al_2O_3$ layer was formed by applying Al alkoxide (Al $(OC_3H_7)_3$) as a raw material for the $Al_2O_3$ layer on the high-density $Al_2O_3$—$SiO_2$ sintered base (sintered base 10) by spin coating, and performing heat treatment at 400° C. A surface of the $Al_2O_3$ layer (base surface flattening layer 12) of obtained composite base 1 was subjected to mechanical polishing and CMP (chemical mechanical polishing), and thus a small surface RMS roughness of 0.6 nm was able to be obtained. Table 1 shows the result.

EXAMPLE A5

Composite base 1 was obtained as in Example A1, except that a 1.5 μm-thick $TiO_2$ layer was formed as base surface flattening layer 12 by the sputtering method. A surface of the $TiO_2$ layer (base surface flattening layer 12) of obtained composite base 1 was subjected to mechanical polishing and CMP (chemical mechanical polishing), and thus a small surface RMS roughness of 0.5 m was able to be obtained. Table 1 shows the result.

EXAMPLE A6

Composite base 1 was obtained as in Example A1, except that a 1.5 μm-thick $TiO_2$ layer was formed as base surface flattening layer 12 by the spin coating method. Specifically, the $TiO_2$ layer was formed by applying Ti alkoxide (Ti $(OC_3H_7)_4$) as a raw material for the $TiO_2$ layer on the high-density $Al_2O_3$—$SiO_2$ sintered base (sintered base 10) by spin coating, and performing heat treatment at 400° C. A surface of the $TiO_2$ layer (base surface flattening layer 12) of obtained composite base 1 was subjected to mechanical polishing and CMP (chemical mechanical polishing), and thus a small surface RMS roughness of 0.5 nm was able to be obtained. Table 1 shows the result.

EXAMPLE A7

A low-density $Al_2O_3$—$SiO_2$ sintered base (relative density: 95% by mass) with a diameter of two inches (50.8 mm) and a thickness of 500 μm was prepared as sintered base 10.

A surface of the low-density $Al_2O_3$—$SiO_2$ sintered base was mechanically polished (with diamond abrasive grains) to obtain a surface RMS roughness of 20 nm.

Next, a 20 μm-thick $SiO_2$ layer was formed as base surface flattening layer 12 on the low-density $Al_2O_3$—$SiO_2$ sintered base (sintered base 10) by the CVD method, and thereby composite base 1 including the 20 μm-thick $SiO_2$ layer (base surface flattening layer 12) disposed on the low-density $Al_2O_3$—$SiO_2$ sintered base (sintered base 10) was obtained. As a material for the $SiO_2$ layer, TEOS was used. A surface of the $SiO_2$ layer (base surface flattening layer 12) of obtained composite base 1 was subjected to mechanical polishing and CMP (chemical mechanical polishing), and thus a small surface RMS roughness of 0.4 nm was able to be obtained. Table 1 shows the result.

EXAMPLE A8

Composite base 1 was obtained as in Example A1, except that a 3 μm-thick MgO—$SiO_2$ layer was formed as base surface flattening layer 12 by the spin coating method. Specifically, the MgO—$SiO_2$ layer was formed by applying Si alkoxide ($Si(OC_2H_5)_4$) and Mg alkoxide ($Mg(OC_2H_5)_2$) as raw materials for the MgO—$SiO_2$ layer on the high-density $Al_2O_3$—$SiO_2$ sintered base (sintered base 10) by spin coating, and performing heat treatment at 400° C. A surface of the MgO—$SiO_2$ layer (base surface flattening layer 12) of obtained composite base 1 was subjected to mechanical polishing and CMP (chemical mechanical polishing), and thus a small surface RMS roughness of 0.6 nm was able to be obtained. Table 1 shows the result.

EXAMPLE A9

A high-density MgO—$SiO_2$ sintered base (relative density: 98% by mass) with a diameter of two inches (50.8 mm) and a thickness of 500 μm was prepared as sintered base 10. A surface of the high-density MgO—$SiO_2$ sintered base was mechanically polished (with diamond abrasive grains) to obtain a surface RMS roughness of 9.4 nm.

Next, a 1.5 μm-thick $SiO_2$ layer was formed as base surface flattening layer 12 on the high-density MgO—$SiO_2$ sintered base (sintered base 10) by the CVD method, and thereby composite base 1 including the 1.5 μm-thick $SiO_2$ layer (base surface flattening layer 12) disposed on the high-density MgO—$SiO_2$ sintered base (sintered base 10) was obtained. As a material for the $SiO_2$ layer, TEOS was used. A surface of the $SiO_2$ layer (base surface flattening layer 12) of obtained composite base 1 was subjected to mechanical polishing and CMP (chemical mechanical polishing), and thus a small surface RMS roughness of 0.6 nm was able to be obtained. Table 1 shows the result.

EXAMPLE A10

Composite base 1 was obtained as in Example A9, except that a 3 μm-thick $Al_2O_3$—$SiO_2$ layer was formed as base surface flattening layer 12 by thermal spraying using a plasma powder spraying method (plasma spraying). A surface of the $Al_2O_3$—$SiO_2$ layer (base surface flattening layer 12) of obtained composite base 1 was subjected to mechanical polishing and CMP (chemical mechanical polishing), and thus a small surface RMS roughness of 0.6 nm was able to be obtained. Table 1 shows the result.

EXAMPLE A11

Composite base 1 was obtained as in Example A1, except that a 1.5 μm-thick $Si_3N_4$ layer was formed as base surface flattening layer 12 by the CVD method. A surface of the $Si_3N_4$ layer (base surface flattening layer 12) of obtained composite base 1 was subjected to mechanical polishing and CMP (chemical mechanical polishing), and thus a small surface RMS roughness of 0.5 m was able to be obtained. Table 1 shows the result.

EXAMPLE AR1

A high-density $Al_2O_3$—$SiO_2$ sintered base (relative density: 98% by mass) with a diameter of two inches (50.8 mm) and a thickness of 500 μm was prepared as sintered base 10. A surface of the high-density $Al_2O_3$—$SiO_2$ sintered base was mechanically polished (with diamond abrasive grains) to obtain a surface RMS roughness of 8.3 nm. Table 1 shows the result. It is to be noted that the numerical value within parentheses in the column for the surface RMS roughness after CMP in Example AR1 indicates a value of the surface RMS roughness obtained after directly forming a 100 nm-thick $SiO_2$ layer (bonding layer 14a) on the high-density $Al_2O_3$—$SiO_2$ sintered base (sintered base 10) and performing CMP on a surface thereof, as described later.

TABLE 1

| | Sintered Base | | Base Surface Flattening Layer | | | Surface RMS |
|---|---|---|---|---|---|---|
| Example A | Material | Surface RMS Roughness (nm) | Material | Formation Method | Thickness (μm) | Roughness after Polishing (nm) |
| Example A1 | $Al_2O_3$—$SiO_2$ | 8.3 | $SiO_2$ | CVD | 1.5 | 0.3 |
| Example A2 | $Al_2O_3$—$SiO_2$ | 8.3 | $SiO_2$ | Spin Coating | 1.5 | 0.6 |
| Example A3 | $Al_2O_3$—$SiO_2$ | 8.3 | $Al_2O_3$ | CVD | 1.5 | 0.6 |
| Example A4 | $Al_2O_3$—$SiO_2$ | 8.3 | $Al_2O_3$ | Spin Coating | 1.5 | 0.6 |
| Example A5 | $Al_2O_3$—$SiO_2$ | 8.3 | $TiO_2$ | Sputtering | 1.5 | 0.5 |
| Example A6 | $Al_2O_3$—$SiO_2$ | 8.3 | $TiO_2$ | Spin Coating | 1.5 | 0.5 |
| Example A7 | $Al_2O_3$—$SiO_2$ | 20 | $SiO_2$ | CVD | 20 | 0.4 |
| Example A8 | $Al_2O_3$—$SiO_2$ | 8.3 | MgO—$SiO_2$ | Spin Coating | 3 | 0.6 |
| Example A9 | MgO—$SiO_2$ | 9.4 | $SiO_2$ | CVD | 1.5 | 0.6 |
| Example A10 | MgO—$SiO_2$ | 9.4 | $Al_2O_3$—$SiO_2$ | Thermal Spraying | 3 | 0.6 |
| Example A11 | $Al_2O_3$—$SiO_2$ | 8.3 | $Si_3N_4$ | CVD | 1.5 | 0.5 |
| Example RA1 | $Al_2O_3$—$SiO_2$ | 8.3 | Not Used | — | — | (7.9) |

Referring to Table 1, the composite bases in which the base surface flattening layer had a surface RMS roughness of not more than 1.0 nm were obtained by forming the base surface flattening layer on the sintered base. In contrast, in the case where the bonding layer was directly formed on the sintered base, it was not possible to obtain a small surface RMS roughness of not more than 1.0 nm, even though the surface of the bonding layer was polished.

EXAMPLE B

EXAMPLE B1

Referring to FIG. 5(A1) and (A2), a 100 nm-thick $SiO_2$ layer (bonding layer 14a) was formed on the $SiO_2$ layer (base surface flattening layer 12) of composite base 1 fabricated in Example A2 described above, by the CVD method.

Further, referring to FIG. 5(B2), on a surface of a GaN crystal body with a diameter of two inches (50.8 mm) and a thickness of 500 μm as semiconductor crystal body 20, a 100 nm-thick $SiO_2$ layer (bonding layer 14b) was formed by the CVD method, and hydrogen ions were implanted into the GaN crystal body (semiconductor crystal body 20) at a depth of about 150 nm from an interface between the GaN crystal body (semiconductor crystal body 20) and the $SiO_2$ layer (bonding layer 14b).

Next, referring to FIG. 5(C2), surfaces of the $SiO_2$ layer (bonding layer 14b) and the $SiO_2$ layer (bonding layer 14b) described above were subjected to CMP (chemical mechanical polishing) to have an RMS roughness of 0.5 nm, and cleaned by oxygen plasma treatment. Thereafter, the surfaces were overlapped with each other, attached by applying pressure thereto under a load of 7 MPa at room temperature (25° C.), to obtain base-crystal bonded body 2B. Obtained base-crystal bonded body 2B was slowly heated from room temperature (25° C.) to 300° C. over three hours to increase bonding strength. By such bonding, the two $SiO_2$ layers (bonding layers 14a, 14b) were integrated to form a 200 nm-thick $SiO_2$ layer (bonding layer 14).

Subsequently, referring to FIG. 5(D2), base-crystal bonded body 2B was heated to 500° C. and subjected to stress, and thereby the GaN crystal body (semiconductor crystal body 20) was separated, at ion implanted region 20i thereof, into a GaN crystal layer (semiconductor crystal layer 20a) and the remaining GaN crystal body (remaining semiconductor crystal body 20b). Thus, composite substrate 3B in which the 150 nm-thick GaN crystal layer (semiconductor crystal layer 20a) was bonded on base surface flattening layer 12 of composite base 1 with bonding layer 14 interposed therebetween was obtained.

EXAMPLE BR1

Figure 6:
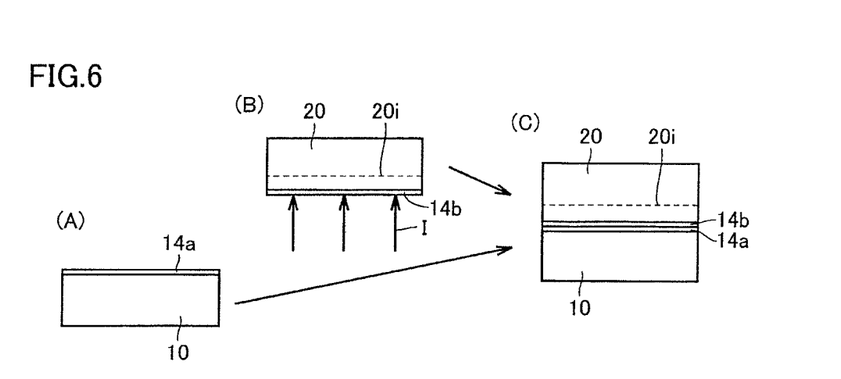
FIG. 6 is a schematic cross sectional view showing an example of a typical method of manufacturing a composite substrate.

Referring to FIG. 6(A), a 100 nm-thick $SiO_2$ layer (bonding layer 14a) was formed on sintered base 10 obtained in Example AR1 described above, by the CVD method. A surface of the $SiO_2$ layer (bonding layer 14a) was subjected to mechanical polishing and CMP (chemical mechanical polishing) to obtain a surface RMS roughness of 7.9 nm. It was not possible to further reduce the surface RMS roughness even though CMP was further performed.

Further, referring to FIG. 6(B), on a surface of a GaN crystal body with a diameter of two inches (50.8 mm) and a thickness of 500 μm as semiconductor crystal body 20, a 100 nm-thick $SiO_2$ layer (bonding layer 14b) was formed by the CVD method, and hydrogen ions were implanted into the GaN crystal body (semiconductor crystal body 20) at a depth of about 150 nm from an interface between the GaN crystal body (semiconductor crystal body 20) and the $SiO_2$ layer (bonding layer 14b).

Next, referring to FIG. 6(C), surfaces of the $SiO_2$ layer (bonding layer 14b) and the $SiO_2$ layer (bonding layer 14b) described above were cleaned by oxygen plasma treatment, and thereafter the surfaces were overlapped with each other and pressurized under a load of 7 MPa at room temperature (25° C.). However, it was not possible to attach the surfaces to each other.

As described above, by using the composite base in which the base surface flattening layer having a surface RMS roughness of not more than 1.0 nm was formed on the sintered base, it was possible to fabricate the composite substrate in which the semiconductor crystal layer was attached on a side of the composite base where the base surface flattening layer was located. In contrast, when the bonding layer was directly formed on the sintered base, it was not possible to fabricate a composite substrate in which the sintered base and the semiconductor crystal layer were attached to each other.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A composite base, comprising:
   a sintered base; and
   a base surface flattening layer disposed on said sintered base,
   wherein said base surface flattening layer has a surface RMS roughness of not more than 1.0 nm, and a thickness of not less than 0.5 μm and not more than 50 μm, and
   said base surface flattening layer includes at least one selected from the group consisting of silicon oxide, silicon nitride, silicon oxynitride, metal oxide, metal nitride, and metal oxynitride, and
   said sintered base includes a composite oxide made of a silicon oxide and a metal oxide.

2. A composite substrate, comprising:
   the composite base according to claim 1; and
   a semiconductor crystal layer disposed on a side of said composite base where said base surface flattening layer is located,
   wherein a difference between a thermal expansion coefficient of said sintered base and a thermal expansion coefficient of said semiconductor crystal layer is not more than $4.5 \times 10^{-6} K^{-1}$.

3. The composite substrate according to claim 2, wherein said base surface flattening layer includes at least one selected from the group consisting of silicon oxide, silicon nitride, silicon oxynitride, metal oxide, metal nitride, and metal oxynitride.

4. The composite substrate according to claim 2, wherein said semiconductor crystal layer includes at least one selected from the group consisting of a group III-V compound semiconductor crystal, a group II-VI compound semiconductor crystal, and an oxide semiconductor crystal.

5. The composite substrate according to claim 2, further comprising a bonding layer disposed between said base surface flattening layer and said semiconductor crystal layer.

6. The composite substrate according to claim 5, further comprising a crystal surface flattening layer disposed between said semiconductor crystal layer and said bonding layer to be in contact with said semiconductor crystal layer.

7. The composite substrate according to claim 6, wherein said crystal surface flattening layer includes at least one selected from the group consisting of silicon oxide, silicon nitride, silicon oxynitride, metal oxide, metal nitride, and metal oxynitride.

* * * * *